(12) United States Patent
Herrick et al.

(10) Patent No.: US 8,173,505 B2
(45) Date of Patent: May 8, 2012

(54) METHOD OF MAKING A SPLIT GATE MEMORY CELL

(75) Inventors: Matthew T. Herrick, Cedar Park, TX (US); Ko-Min Chang, Austin, TX (US); Gowrishankar L. Chindalore, Austin, TX (US); Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 350 days.

(21) Appl. No.: 12/254,331

(22) Filed: Oct. 20, 2008

(65) Prior Publication Data

US 2010/0099246 A1    Apr. 22, 2010

(51) Int. Cl.
*H01L 21/336* (2006.01)

(52) U.S. Cl. ........ 438/258; 438/257; 438/259; 438/430; 438/446; 438/176; 438/195; 438/225; 438/266; 438/429; 257/E21.422; 257/E21.68; 257/E21.678; 257/E21.679

(58) Field of Classification Search ............... 438/258
See application file for complete search history.

(56) References Cited

U.S. PATENT DOCUMENTS

| | | | | |
|---|---|---|---|---|
| 5,635,423 A * | 6/1997 | Huang et al. | ............... | 438/638 |
| 5,930,636 A * | 7/1999 | Oki et al. | ............... | 438/314 |
| 6,696,329 B2 * | 2/2004 | Nakagawa | ............... | 438/201 |
| 6,844,586 B2 * | 1/2005 | Ding | ............... | 257/315 |
| 6,881,994 B2 * | 4/2005 | Lee et al. | ............... | 257/296 |
| 6,998,309 B2 * | 2/2006 | Cho et al. | ............... | 438/257 |
| 2002/0137296 A1 * | 9/2002 | Satoh et al. | ............... | 438/301 |
| 2003/0198086 A1 * | 10/2003 | Shukuri | ............... | 365/185.18 |
| 2004/0013001 A1 | 1/2004 | Park et al. | | |
| 2005/0042828 A1 * | 2/2005 | Moon et al. | ............... | 438/266 |
| 2005/0110088 A1 * | 5/2005 | Hofmann et al. | ............... | 257/347 |
| 2005/0243606 A1 * | 11/2005 | Ding | ............... | 365/185.24 |
| 2007/0052007 A1 | 3/2007 | Jung | | |

(Continued)

FOREIGN PATENT DOCUMENTS

KR    100276654 B1    2/2000

(Continued)

OTHER PUBLICATIONS

PCT/US2009/058676 International Search Report and Written Opinion mailed Apr. 12, 2010.

*Primary Examiner* — Alexander Ghyka
(74) *Attorney, Agent, or Firm* — James L. Clingan, Jr.; Joanna G. Chiu

(57) ABSTRACT

A method includes forming a first layer of gate material over a semiconductor substrate; forming a hard mask layer over the first layer; forming an opening; forming a charge storage layer over the hard mask layer and within the opening; forming a second layer of gate material over the charge storage layer; removing a portion of the second layer and a portion of the charge storage layer which overlie the hard mask layer, wherein a second portion of the second layer remains within the opening; forming a patterned masking layer over the hard mask layer and over the second portion, wherein the patterned masking layer defines both a first and second bitcell; and forming the first and second bitcell using the patterned masking layer, wherein each of the first and second bitcell comprises a select gate made from the first layer and a control gate made from the second layer.

10 Claims, 6 Drawing Sheets

U.S. PATENT DOCUMENTS

| | | |
|---|---|---|
| 2007/0077705 A1 | 4/2007 | Prinz et al. |
| 2007/0218631 A1* | 9/2007 | Prinz et al. .................... 438/258 |
| 2007/0218633 A1 | 9/2007 | Prinz et al. |
| 2007/0224747 A1* | 9/2007 | Rochel et al. ................. 438/197 |
| 2008/0076221 A1 | 3/2008 | Kang et al. |

FOREIGN PATENT DOCUMENTS

| | | |
|---|---|---|
| KR | 100276651 B1 | 10/2000 |
| KR | 1020010036790 A | 10/2001 |

* cited by examiner

METHOD OF MAKING A SPLIT GATE MEMORY CELL

BACKGROUND

1. Field

This disclosure relates generally to semiconductor memories, and more specifically, to making non-volatile memories (NVMs) that have a split gate.

2. Related Art

Split gate non-volatile memories (NVM) have been found to provide much benefit for reliable operation. Difficulties in manufacturing, however, have arisen in processing such structures. The close proximity of two gates that are separated by a charge storage layer, which may comprise nanocrystals, is part of the issue. Further the integration of the NVM with logic transistors increases the number of process steps.

Thus, there is a need for improvement in the manufacturing of split gate NVMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a first layer of gate material is formed over a gate dielectric and hard mask material is formed over the gate material. An opening is formed in the hard mask material and the gate material. The opening is lined with a charge storage layer that may comprise nanocrystals. A second layer, which is preferably relatively thick, of gate material is deposited and fills the opening. An etch back, preferably performed by chemical mechanical polishing (CMP), results in the second layer being even with a top surface of the remaining hard mask material. The second layer can remain at this level or can even be etched further so as to be at a lower height than the first layer of gate material. A patterned etch of the second layer and the first layer simultaneously forms select gates, control gates, and logic gates. Subsequent processing removes the hard mask layer, forms sidewall spacers, and source/drain regions. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
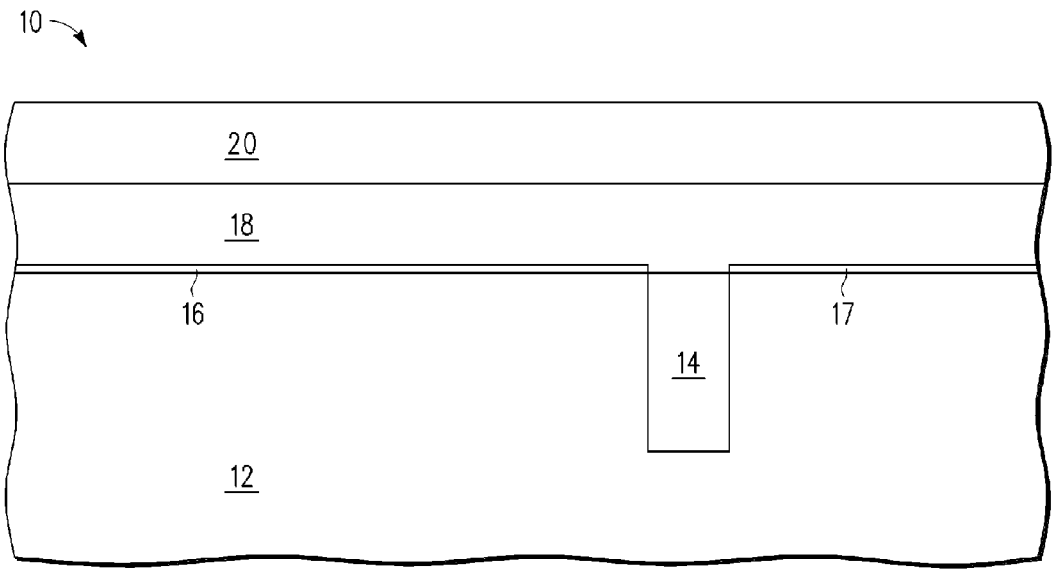
FIG. 1 is a cross section of a device structure at a stage in processing according to an embodiment.

Shown in FIG. 1 is a semiconductor device 10 comprising a semiconductor substrate 12, an isolation region 14 in substrate 12, a gate dielectric layer 16 on substrate 12 one side of isolation region 14, a gate dielectric layer 17 on substrate 12 on an opposite side of isolation region from gate dielectric layer 16, a polysilicon layer 18 on gate dielectric layers 16 and 17 and isolation region 14, and a nitride layer 20 over polysilicon layer 20. Nitride layer 20 functions as a hard mask and may be of another suitable material. The side with gate dielectric 16 is where non-volatile memory (NVM) cells are to be formed. The side with gate dielectric 17 is where logic transistors are to be formed. Logic transistors are for performing any of a variety of logic functions and are generally designed for speed. Nitride layer 20 and polysilicon layer 18 may each be about 1500 Angstroms thick. Other thicknesses may be used but nitride layer 20 should be at least 500 Angstroms because it is used as a hard mask and not just as an anti-reflective coating (ARC). Similarly, polysilicon layer 18 may be other thicknesses but is preferably at least 500 Angstroms. Gate dielectrics 16 and 17 may be formed at the same time and thus be the same thickness which is beneficial if that is effective. If different gate dielectrics are needed they may be of a different material or different thickness. Gate dielectrics 16 and 17 may be thermally grown to about 40 Angstroms. Gate dielectrics can vary and may be of different materials and thicknesses. It may desirable to have a thin oxide layer, perhaps only 80 Angstroms, between polysilicon layer 18 and nitride layer 20.

Figure 2:
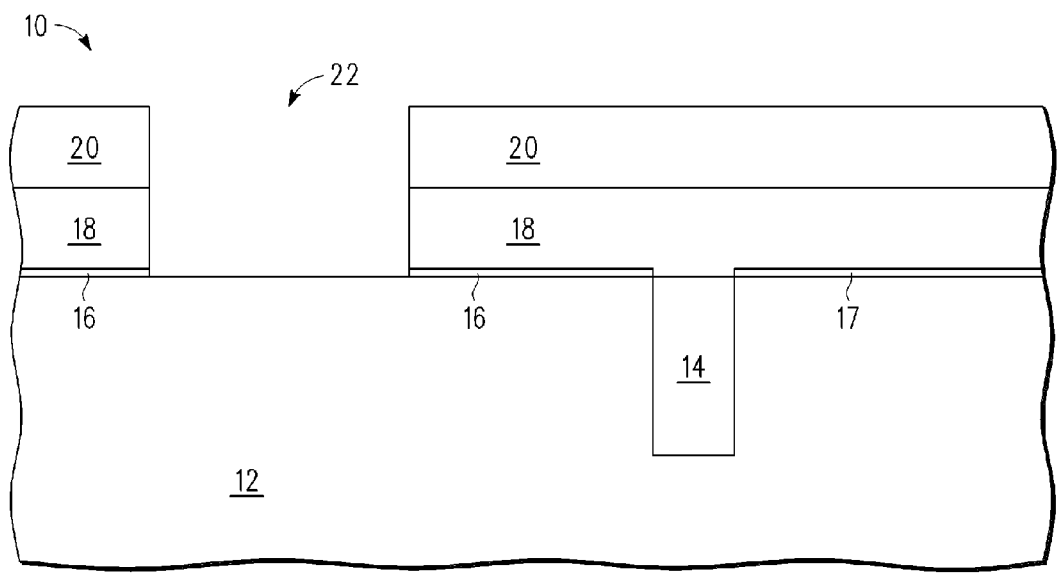
FIG. 2 is a cross section of the device structure of FIG. 1 at a subsequent step in processing.

Shown in FIG. 2 is semiconductor device 10 after performing a patterned etch through hard mask 20, polysilicon layer 18, and gate dielectric 16 to form an opening 22 on the NVM side. Opening 22 may be about 5000 Angstroms wide. This is an anisotropic etch.

Figure 3:
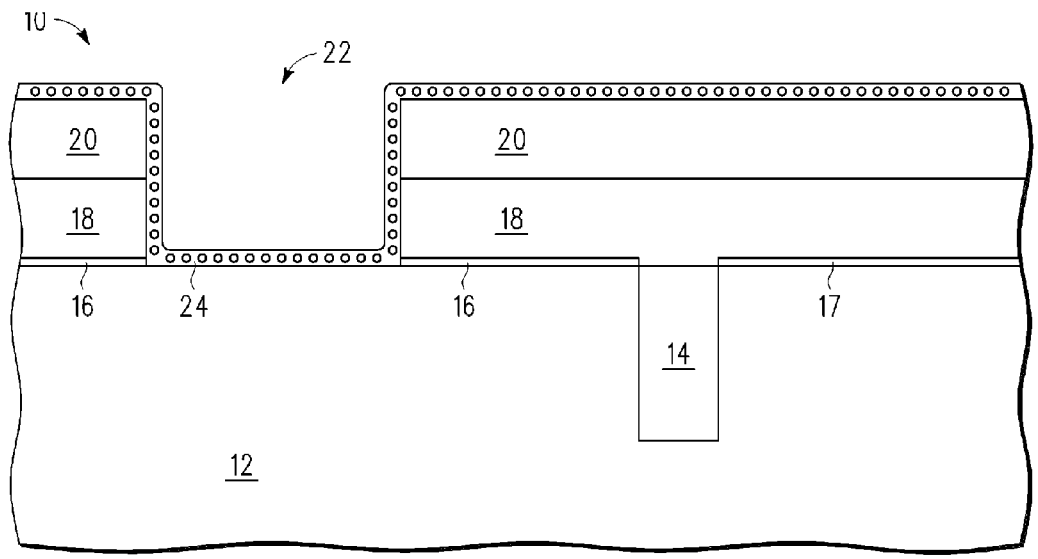
FIG. 3 is a cross section of the device structure of FIG. 2 at a subsequent step in processing.

Shown in FIG. 3 is semiconductor device 10 after depositing a charge storage layer 24 in opening 22 and over hard mask layer 20. Charge storage layer 24 may use nanocrystals for charge storage. In such case charge storage layer 24 may be made by first forming a dielectric layer followed by nanocrystal formation. Another dielectric layer is formed around and over the nanocrystals. Another charge material such as nitride may also be effective. Charge storage layer 24 may be about 200 Angstroms thick. This thickness may vary, especially if large nanocrystals, ones around 100 Angstroms or bigger are used.

Figure 4:
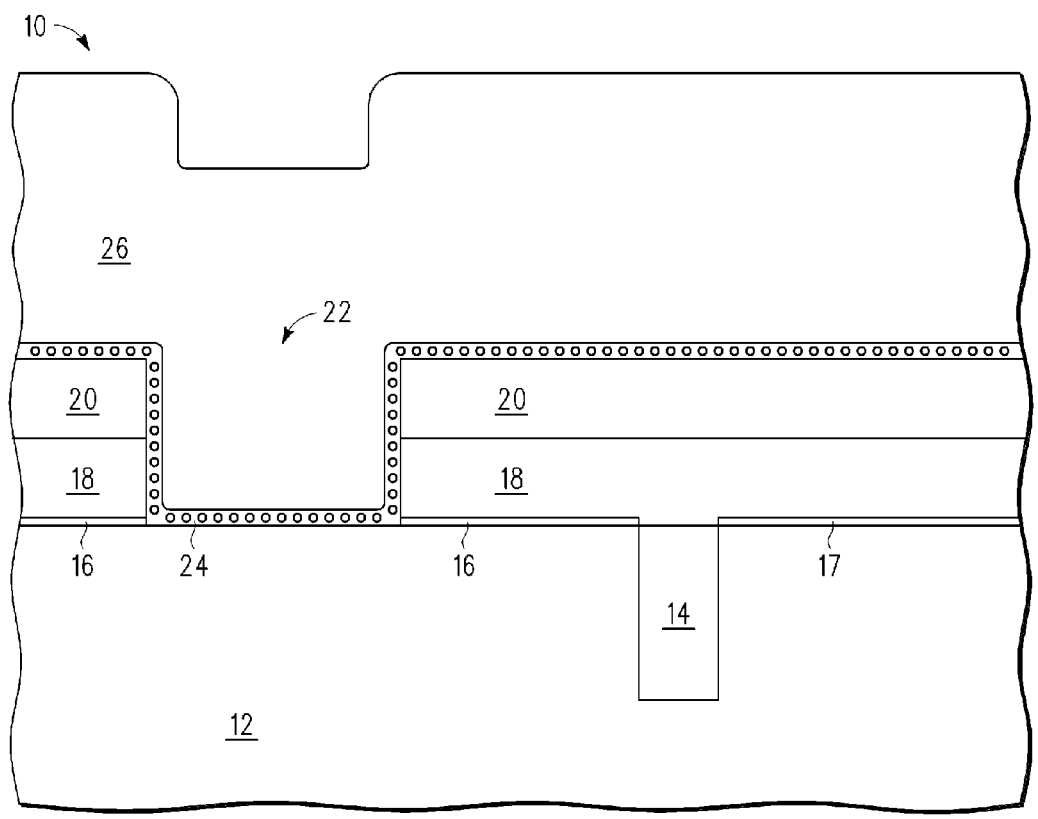
FIG. 4 is a cross section of the device structure of FIG. 3 at a subsequent step in processing.

Shown in FIG. 4 is semiconductor device 10 after depositing a polysilicon layer 26 over charge storage layer 24. Polysilicon layers 18 and 26, being polysilicon are useful in forming gates such as gates for use as control gates, gates for use as select gates, and gates for use as gates in transistors that perform logic functions as distinct from being an NVM. Other materials, such as conductive materials, may be found to be useful. For example, much work is being done in making metals useful as gates. Polysilicon layer 26 is preferably relatively thick, at least as thick as the depth of opening 22 in FIG. 12. In this case this may be about 2800 Angstroms. In practice it is preferable that it be even thicker, for example about 5000 Angstroms.

Figure 5:
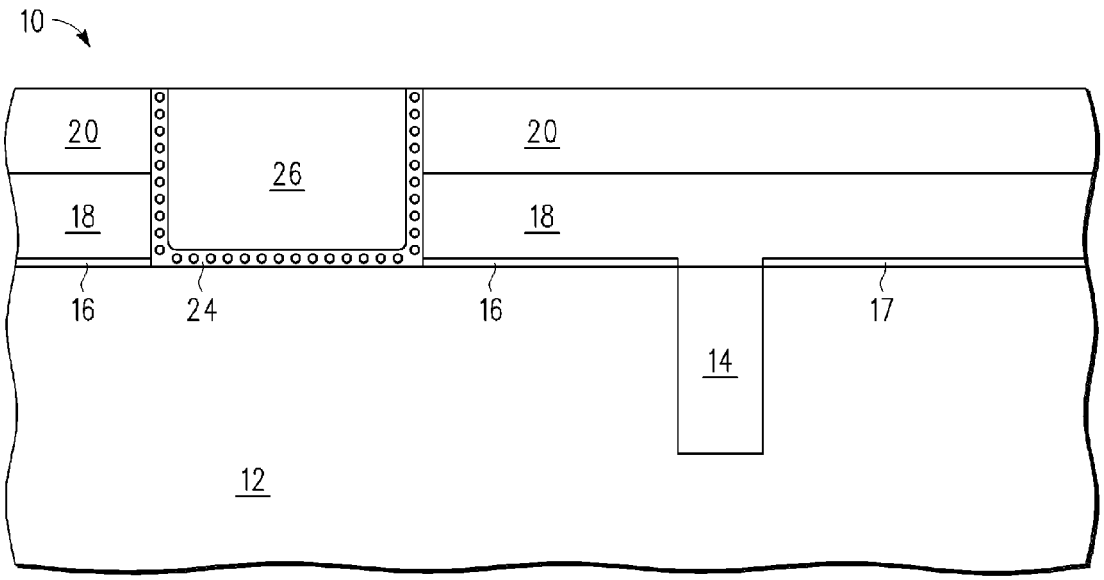
FIG. 5 is a cross section of the device structure of FIG. 4 at a subsequent step in processing.

Shown in FIG. 5 is semiconductor device 10 after chemical mechanical polishing (CMP) polysilicon layer 26 so that a top surface of the remaining portion of polysilicon layer 26 is even with a top surface of nitride layer 20.

Figure 6:
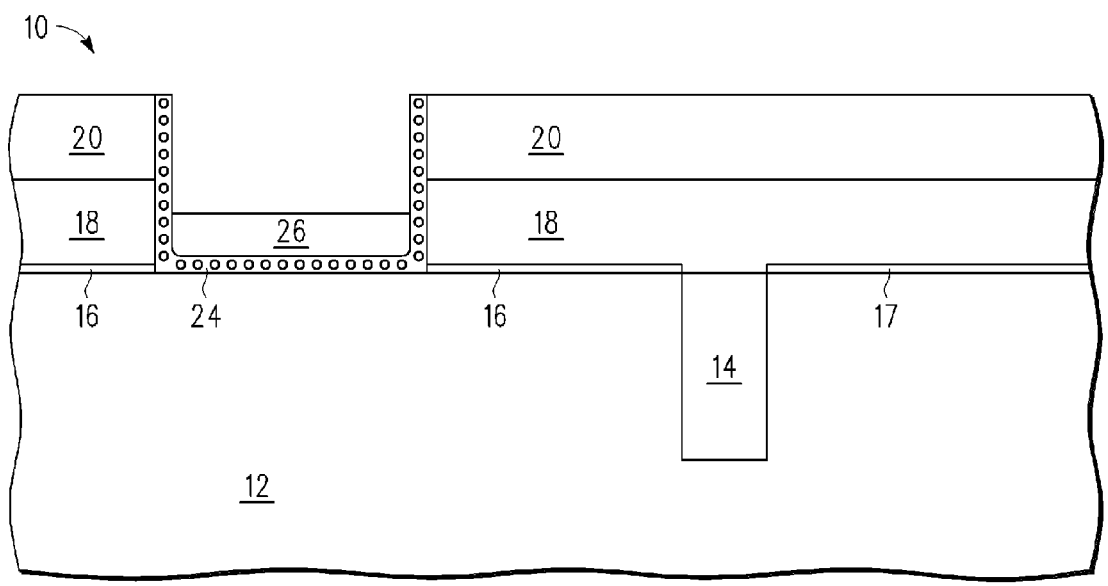
FIG. 6 is a cross section of the device structure of FIG. 5 at a subsequent step in processing.

Shown in FIG. 6 is semiconductor device 10 after an etch back is performed to lower the height of the remaining portion of polysilicon layer 26 below that of a top surface of polysilicon layer 18. The etch back is performed using a chemistry that is selective between nitride and polysilicon. Such a chemistry may also be selective to oxide so that charge storage layer 24 is not significantly etched. An example of such an etch is a reactive ion etch using a chlorine based chemistry. One such example is $Cl_2$+HBr, He+$O_2$, and $CF_4$.

Figure 7:
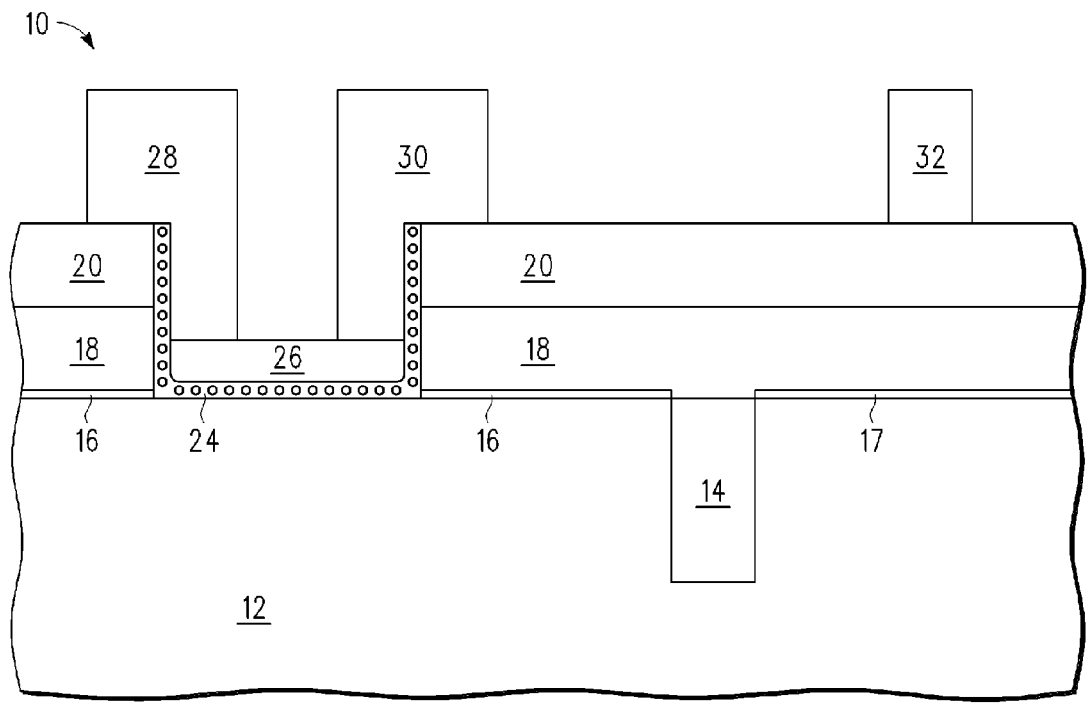
FIG. 7 is a cross section of the device structure of FIG. 6 at a subsequent step in processing.

Shown in FIG. 7 is semiconductor device 10 after depositing and patterning a photoresist layer to leave photoresist portions 28, 30, and 32. Photoresist portion 28 overlaps a portion of nitride layer 20 and a portion of polysilicon layer 26 on one side of the opening in which the remaining portion of polysilicon layer 26 resides. Photoresist portion 30 overlaps a portion of nitride layer 20 and a portion of polysilicon layer 26 on the other side of the opening in which the remaining portion of polysilicon layer 26 resides. Photoresist portion 32 is over the logic portion where a logic transistor is to be performed.

Figure 8:
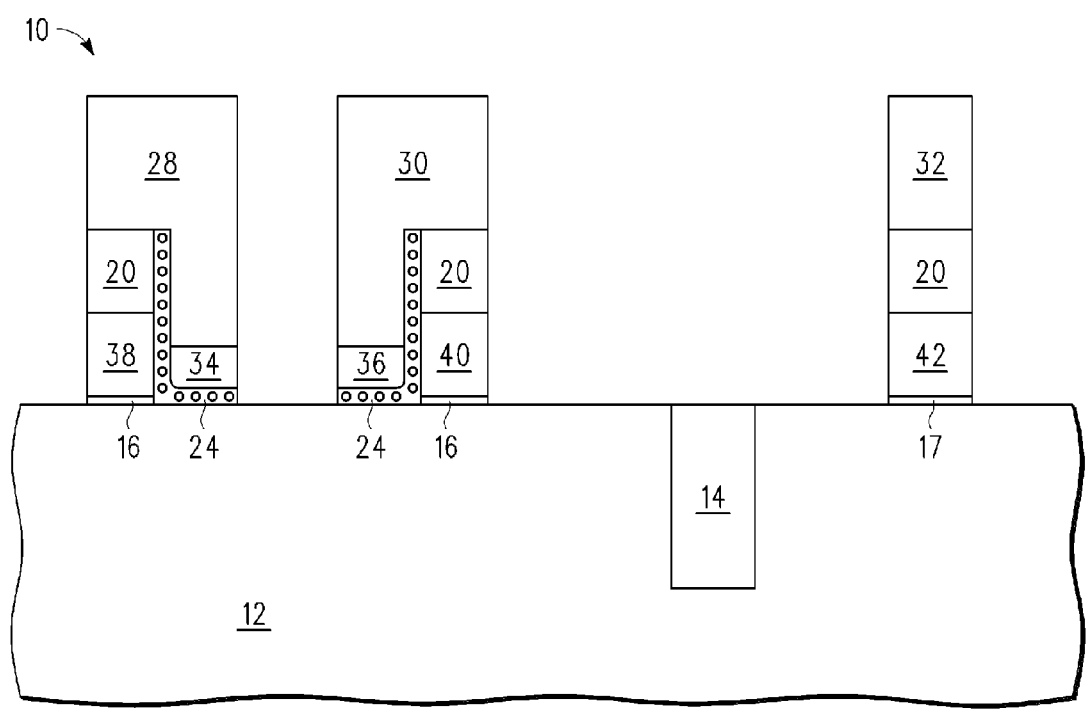
FIG. 8 is a cross section of the device structure of FIG. 7 at a subsequent step in processing.

Shown in FIG. 8 is semiconductor device 10 after etching through nitride layer 20 polysilicon layer 18 using photoresist portions 28, 30, and 32 to leave select gates 34 and 36 and logic gate 42 remaining from polysilicon layer 18 under photoresist portions 28, 30, and 32, respectively. The etching is also through polysilicon layer 26 and charge storage layer 24 which leaves control gates 38 and 40 remaining from polysilicon layer 26 under photoresist portions 28 and 30, respectively. This etch is in three steps. The first step is an etch of nitride. The second step is an etch of polysilicon. Although polysilicon 36 is thinner than polysilicon 40 and thus polysilicon 36 is over etched, charge storage layer 24 acts as an etch stop. Thus, substrate 12 is protected during the period of over etching. The third step is an etch through charge storage layer 24. During the etching there may be substantial erosion of photoresist portions 28, 30, and 32. The etchants for removing nitride, polysilicon, and a charge storage layer of nanocrystals are well known.

Figure 9:
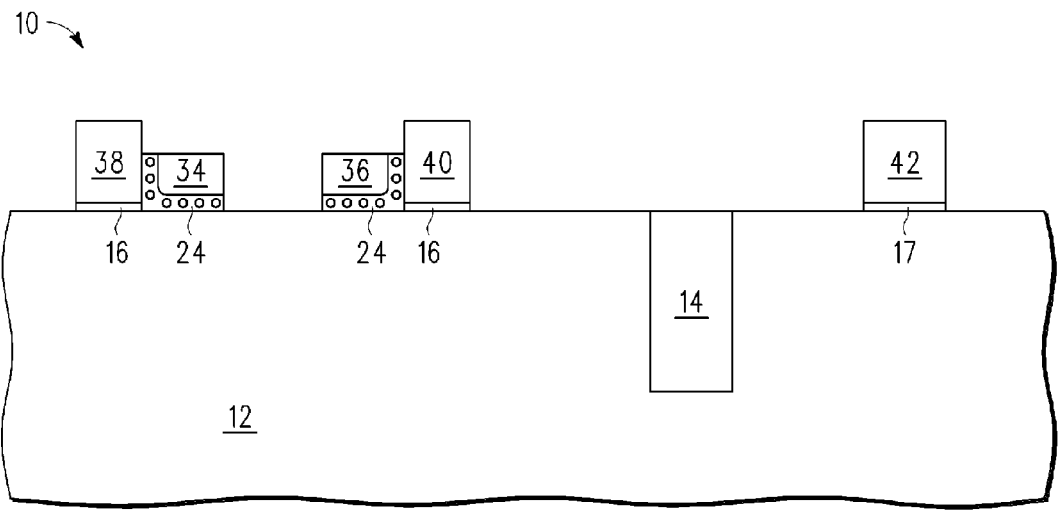
FIG. 9 is a cross section of the device structure of FIG. 8 at a subsequent step in processing.

Shown in FIG. 9 is semiconductor device 10 after removing photoresist portions 28, 30, and 32 and the remaining portions of nitride layer 20. The vertical portions of charge storage layer 24 are also reduced in height during nitride etch. A wet etch of hot phosphoric acid may be used for this etch of nitride which is highly selective to oxide in such case it may be desirable to have the thin oxide layer described earlier between polysilicon layer 18 and nitride layer 20 because hot phosphoric acid can pit polysilicon.

Figure 10:
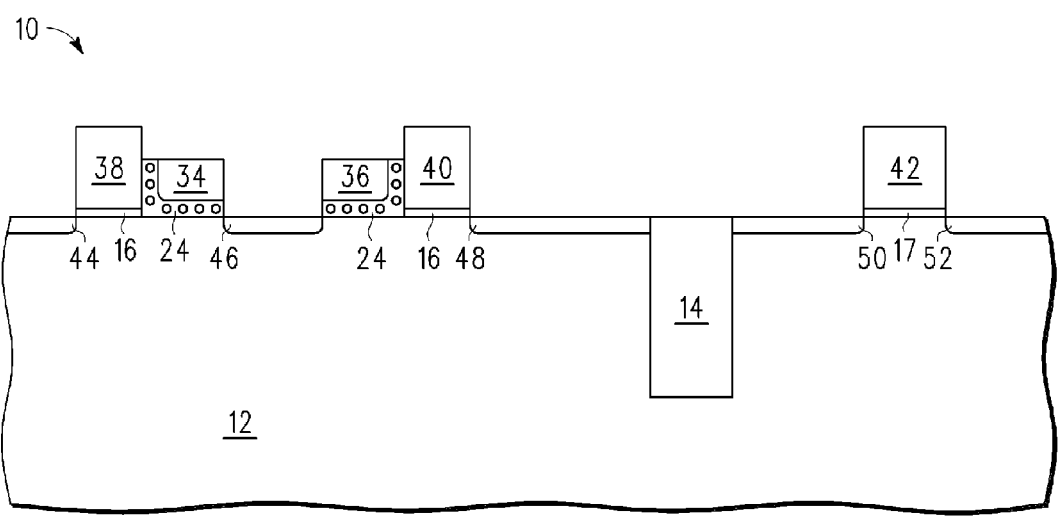
FIG. 10 is a cross section of the device structure of FIG. 9 at a subsequent step in processing.

Shown in FIG. 10 is semiconductor device 10 after performing a low concentration source/drain implant for use in forming source/drain extensions which results in forming lightly doped regions 44, 46, 48, 50, and 52. This implant may be of n-type dopants such as arsenic and phosphorus.

Figure 11:
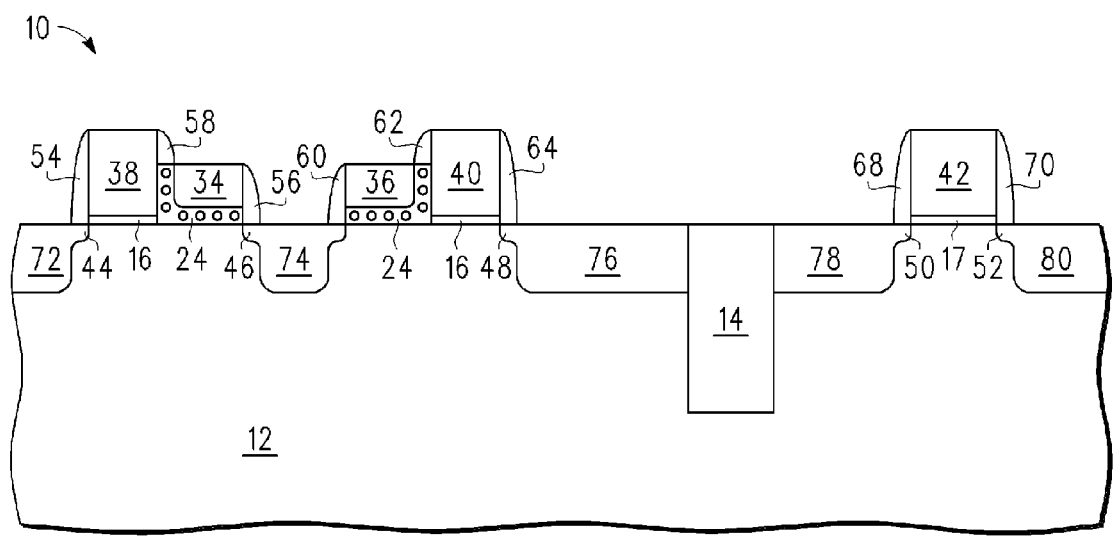
FIG. 11 is a cross section of the device structure of FIG. 10 at a subsequent step in processing.

Shown in FIG. 11 is semiconductor device 10 after forming a plurality of sidewall spacers shown in cross section as sidewall spacers 54 and 58 on sides of select gate 38, sidewall spacer 56 on a side of select gate 34, sidewall spacer 60 on a side of select gate 36, sidewall spacers 62 and 64 on sides of select gate 40, and sidewall spacers 68 and 70 on sides of logic gate 42. Using the sidewall spacers as a mask, an implant is performed to form heavily-doped source/drain regions 72, 74, 76, 78, 80, and 82.

Thus, semiconductor device 10 shows that a pair of bitcells share a common doped region 56 which may be considered a drain. The sources and drains may be reversed in some schemes depending on how the select and control gates are utilized in programming and erase. Also two bitcells have their gates defined with just two masking steps and further that a logic transistor has its gate defined by one of those two masking steps. One step is the formation of opening 22. The other step is the use of photoresist portions shown in FIGS. 7 and 8.

By now it should be appreciated that there has been provided a method for forming a semiconductor structure. The method includes forming a gate dielectric layer over a semiconductor substrate. The method further includes forming a first layer of gate material over the gate dielectric layer. The method further includes forming a hard mask layer over the first layer of gate material. The method further includes forming an opening through the hard mask layer and the first layer of gate material. The method further includes forming a charge storage layer over the hard mask layer and within the opening. The method further includes forming a second layer of gate material over the charge storage layer, wherein a thickness of the second layer of gate material is at least as great as a total thickness of the first layer of gate material and the hard mask layer. The method further includes removing a portion of the second layer of gate material and a portion of the charge storage layer which overlie the hard mask layer, wherein the removing uses the hard mask layer as a stopping layer, and wherein a second portion of the second layer of gate material remains within the opening. The method further includes forming a patterned masking layer over the hard mask layer and over the second portion of the second layer of gate material within the opening, wherein the patterned masking layer defines both a first bitcell and a second bitcell. The method further includes forming the first bitcell and the second bitcell using the patterned masking layer, wherein each of the first bitcell and the second bitcell comprises a select gate made from the first layer of gate material and a control gate made from the second layer of gate material. The method may further comprise recessing the second portion of the second layer of gate material within the opening such that after the recessing a top surface of the second portion of the second layer of gate material within the opening is not coplanar with a top surface of the first layer of gate material. The method may be further characterized by the forming the hard mask layer over the first layer of gate material being further characterized by the hard mask layer having a thickness of 500 Angstroms or greater. The method may be further characterized by the forming the hard mask layer over the first layer of gate material being further characterized by the hard mask layer being a nitride layer. The method may be further characterized by the removing the portion of the second layer of gate material and the portion of the charge storage layer which overlie the hard mask layer being further characterized as performing a chemical-mechanical polish to remove the portion of the second layer of gate material and the portion of the charge storage layer which overlie the hard mask layer. The method may be further characterized by the forming the patterned masking layer being further characterized by the patterned masking layer further defining a gate of a logic transistor. The method may further comprise forming the gate of the logic transistor using the patterned masking layer, wherein the gate of the logic transistor is made from the first layer of gate material. The method may be further characterized by the forming the charge storage layer is further characterized by the charge storage layer comprising nanocrystals. The method may be further characterized by the forming the second layer of gate material over the charge storage layer being further characterized by the second layer of gate material having a thickness of 5000 Angstroms or greater.

Also described is a method for forming a semiconductor structure. The method includes forming a first layer of gate material over a semiconductor substrate. The method further includes forming a hard mask layer over the first layer of gate material. The method further includes forming an opening through the hard mask layer and the first layer of gate material. The method further includes forming a charge storage layer over the hard mask layer and within the opening. The method further includes forming a second layer of gate material over the charge storage layer, wherein a thickness of the second layer of gate material is at least as great as a total thickness of the first layer of gate material and the hard mask layer. The method further includes removing a portion of the second layer of gate material and a portion of the charge storage layer which overlie the hard mask layer, wherein the removing uses the hard mask layer as a stopping layer, and wherein a second portion of the second layer of gate material remains within the opening. The method further includes forming a patterned masking layer over the hard mask layer and over the second portion of the second layer of gate material within the opening, wherein the patterned masking layer defines a first bitcell, a second bitcell, and a gate of a logic transistor. The method further includes forming the first bitcell and the second bitcell using the patterned masking layer, wherein each of the first bitcell and the second bitcell comprises a select gate made from the first layer of gate material and a control gate made from the second layer of gate material. The method further includes forming the gate of the logic transistor using the patterned masking layer, wherein the gate of the logic transistor is made from the first layer of gate material. The method may further include recessing the second portion of the second layer of gate material within the opening such that after the recessing a top surface of the second portion of the second layer of gate material within the opening is not coplanar with a top surface of the first layer of gate material. The method may be further characterized by the forming the hard mask layer over the first layer of gate material being further characterized by the hard mask layer having a thickness of 500 Angstroms or greater. The method may be further characterized by the forming the hard mask layer over the first layer of gate material being further characterized by the hard mask layer being a nitride layer. The method may be further characterized by the removing the portion of the second layer of gate material and the portion of the charge storage layer which overlie the hard mask layer is further characterized as performing a chemical-mechanical polish to remove the portion of the second layer of gate material and the portion of the charge storage layer which overlie the hard mask layer. The method may be further characterized by the forming the charge storage layer is further characterized by the charge storage layer comprising nanocrystals. The method may be further characterized by the forming the second layer of gate material over the charge storage layer is further characterized by the second layer of gate material having a thickness of 5000 Angstroms or greater.

Described also is a method for forming a semiconductor structure. The method includes forming a first layer of gate material over a semiconductor substrate. The method further includes forming an opening through the hard mask layer and the first layer of gate material. The method further includes forming a charge storage layer over the hard mask layer and within the opening. The method further includes forming a second layer of gate material over the charge storage layer, wherein a thickness of the second layer of gate material is at least as great as a total thickness of the first layer of gate material and the hard mask layer. The method further includes removing a portion of the second layer of gate material and a portion of the charge storage layer which overlie the hard mask layer, wherein the removing uses the hard mask layer as a stopping layer, and wherein a second portion of the second layer of gate material remains within the opening. The method further includes recessing the second portion of the second layer of gate material within the opening. The method further includes forming a patterned masking layer over the hard mask layer and over the second portion of the second layer of gate material within the opening, wherein the patterned masking layer defines both a first bitcell and a second bitcell. The method further includes forming the first bitcell and the second bitcell using the patterned masking layer, wherein each of the first bitcell and the second bitcell comprises a select gate made from the first layer of gate material and a control gate made from the second layer of gate material. The method may be further characterized by the removing the portion of the second layer of gate material and the portion of the charge storage layer which overlie the hard mask layer being further characterized as performing a chemical-mechanical polish to remove the portion of the second layer of gate material and the portion of the charge storage layer which overlie the hard mask layer. The method may be further characterized by the forming the patterned masking layer being further characterized by the patterned masking layer further defining a gate of a logic transistor, and wherein the method further comprises forming the gate of the logic transistor using the patterned masking layer, wherein the gate of the logic transistor is made from the first layer of gate material. The method may be further characterized by the forming the second layer of gate material over the charge storage layer is further characterized by the second layer of gate material having a thickness of 5000 Angstroms or greater.

Although the invention is described herein with reference to specific embodiments, various modifications and changes can be made, some of which have been described previously, without departing from the scope of the present invention as set forth in the claims below. For example, a CMP step was described for planarizing polysilicon layer 26 with nitride layer 20, an etch back process may be an alternative for achieving this. Also polysilicon was described as the gate material but a metal gate over a high k dielectric may also be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor structure, the method comprising:
   forming a first layer of gate material over a semiconductor substrate;
   forming a hard mask layer over the first layer of gate material;
   forming an opening through the hard mask layer and the first layer of gate material;
   forming a charge storage layer over the hard mask layer and within the opening;
   forming a second layer of gate material over the charge storage layer, wherein a thickness of the second layer of gate material is at least as great as a total thickness of the first layer of gate material and the hard mask layer;
   removing a portion of the second layer of gate material and a portion of the charge storage layer which overlie the hard mask layer, wherein the removing uses the hard mask layer as a stopping layer, and wherein a second portion of the second layer of gate material remains within the opening;
   forming a patterned masking layer over the hard mask layer and over the second portion of the second layer of gate material within the opening, wherein the patterned masking layer defines a first bitcell, a second bitcell, and a gate of a logic transistor;
   forming the first bitcell and the second bitcell using the patterned masking layer, wherein each of the first bitcell and the second bitcell comprises a select gate made from the first layer of gate material and a control gate made from the second layer of gate material; and
   forming the gate of the logic transistor using the patterned masking layer, wherein the gate of the logic transistor is made from the first layer of gate material.

2. The method of claim 1, further comprising:
   recessing the second portion of the second layer of gate material within the opening such that after the recessing a top surface of the second portion of the second layer of gate material within the opening is not coplanar with a top surface of the first layer of gate material.

3. The method of claim 1, wherein the forming the hard mask layer over the first layer of gate material is further characterized by the hard mask layer having a thickness of 500 Angstroms or greater.

4. The method of claim 1, wherein the forming the hard mask layer over the first layer of gate material is further characterized by the hard mask layer being a nitride layer.

5. The method of claim 1, wherein the removing the portion of the second layer of gate material and the portion of the charge storage layer which overlie the hard mask layer is further characterized as performing a chemical-mechanical polish to remove the portion of the second layer of gate material and the portion of the charge storage layer which overlie the hard mask layer.

6. The method of claim 1, wherein the forming the charge storage layer is further characterized by the charge storage layer comprising nanocrystals.

7. The method of claim 1, wherein the forming the second layer of gate material over the charge storage layer is further characterized by the second layer of gate material having a thickness of 5000 Angstroms or greater.

8. A method for forming a semiconductor structure, the method comprising:
   forming a first layer of gate material over a semiconductor substrate;
   forming a hard mask layer over the first layer of gate material, wherein the hard mask layer has a thickness of 500 Angstroms or greater;
   forming an opening through the hard mask layer and the first layer of gate material;
   forming a charge storage layer over the hard mask layer and within the opening;
   forming a second layer of gate material over the charge storage layer, wherein a thickness of the second layer of gate material is at least as great as a total thickness of the first layer of gate material and the hard mask layer;
   removing a portion of the second layer of gate material and a portion of the charge storage layer which overlie the hard mask layer, wherein the removing uses the hard mask layer as a stopping layer, and wherein a second portion of the second layer of gate material remains within the opening;
   recessing the second portion of the second layer of gate material within the opening;
   forming a patterned masking layer over the hard mask layer and over the second portion of the second layer of gate material within the opening,
      wherein the patterned masking layer defines both a first bitcell and a second bitcell, and further defines a gate of a logic transistor;
   forming the gate of the logic transistor using the patterned masking layer, wherein the gate of the logic transistor is made from the first layer of gate material; and
   forming the first bitcell and the second bitcell using the patterned masking layer, wherein each of the first bitcell and the second bitcell comprises a select gate made from the first layer of gate material and a control gate made from the second layer of gate material.

9. The method of claim 8, wherein the removing the portion of the second layer of gate material and the portion of the charge storage layer which overlie the hard mask layer is further characterized as performing a chemical-mechanical polish to remove the portion of the second layer of gate material and the portion of the charge storage layer which overlie the hard mask layer.

10. The method of claim 8, wherein the forming the second layer of gate material over the charge storage layer is further characterized by the second layer of gate material having a thickness of 5000 Angstroms or greater.

* * * * *